(12) United States Patent
Chiu et al.

(10) Patent No.: US 9,865,782 B2
(45) Date of Patent: Jan. 9, 2018

(54) LED PACKAGE STRUCTURE AND LENS THEREOF

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Kuo-Ming Chiu, New Taipei (TW); Yu-Yu Chang, Kaohsiung (TW); Han-Hsing Peng, New Taipei (TW); Heng-I Lee, Taichung (TW); Shih-Chiang Yen, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/268,186

(22) Filed: Sep. 16, 2016

(65) Prior Publication Data
US 2017/0352790 A1    Dec. 7, 2017

(30) Foreign Application Priority Data
Jun. 1, 2016 (CN) .......................... 2016 1 0383055

(51) Int. Cl.
| H01L 31/0232 | (2014.01) |
| H01L 33/58 | (2010.01) |
| H01L 33/48 | (2010.01) |

(52) U.S. Cl.
CPC ............ *H01L 33/58* (2013.01); *H01L 33/486* (2013.01)

(58) Field of Classification Search
CPC ....... H01L 33/58; H01L 33/486; H01L 33/42; H01L 33/405; H01L 31/054
(Continued)

(56) References Cited

U.S. PATENT DOCUMENTS

| 7,355,560 B2 * | 4/2008 | Nagai | ...................... H01Q 15/08 343/911 R |
| 7,543,959 B2 * | 6/2009 | Bierhuizen | ............ H04N 9/315 257/98 |

(Continued)

*Primary Examiner* — Nitin Parekh
(74) *Attorney, Agent, or Firm* — Li & Cai Intellectual Property (USA) Office

(57) ABSTRACT

A lens of an LED package structure includes a square-shaped base layer, a first light-guiding portion integrally connected to the base layer, a second light-guiding portion taperedly extended from the first light-guiding portion. The second light-guiding portion has an apex located away from the first light-guiding portion. The lens includes four side curved surfaces and four boundary curved surfaces connected to the apex. Four first projecting regions are defined by orthogonally projecting the four boundary curved surfaces onto the base layer, and the four first projecting regions are arranged on two diagonals of the base layer. Any two adjacent boundary curved surfaces are provided with one of the side curved surfaces there-between. Each boundary curved surface has a first radius of curvature ($R_1$), a portion of each side curved surface arranged on the second light-guiding portion has a second radius of curvature ($R_2$), wherein $R_1/R_2 = M\sqrt{2}$ and $M=0.8\sim1.2$.

20 Claims, 16 Drawing Sheets

(58) Field of Classification Search
USPC .......................................... 257/98, 432, 436
See application file for complete search history.

(56) References Cited

U.S. PATENT DOCUMENTS

| | | | | |
|---|---|---|---|---|
| 8,269,916 | B2* | 9/2012 | Ohkawa | G02F 1/133606 257/88 |
| 8,368,097 | B2* | 2/2013 | Kim | H01L 33/54 257/98 |
| 2007/0176187 | A1* | 8/2007 | Iwanaga | F21K 9/00 257/79 |
| 2010/0265983 | A1* | 10/2010 | Adachi | G02B 6/4214 372/50.23 |
| 2012/0081614 | A1* | 4/2012 | Yamamoto | G02F 1/133603 348/725 |
| 2013/0135876 | A1* | 5/2013 | Phillips, III | F21V 5/04 362/335 |
| 2015/0221623 | A1* | 8/2015 | Tischler | H01L 25/165 257/89 |
| 2016/0056352 | A1* | 2/2016 | Koike | H01L 33/22 257/98 |
| 2016/0381749 | A1* | 12/2016 | Catalano | F21S 10/00 315/297 |

\* cited by examiner

US 9,865,782 B2

LED PACKAGE STRUCTURE AND LENS THEREOF

BACKGROUND OF THE INVENTION

1. Field of the Invention

The instant invention relates to an LED; in particular, to an LED package structure and a lens thereof.

2. Description of Related Art

The conventional LED package structure includes a lens, and an outer curved surface of the lens is substantially formed according to one center of curvature, such as a hemispherical lens, a lens formed by slicing a hemispherical lens, or an oval lens. However, the lens of the conventional LED package structure is limited to the above conventional shapes, so it is difficult to improve the light extraction efficiency of the conventional LED package structure by changing the construction of the lens with large chip-mounting area.

SUMMARY OF THE INVENTION

The instant disclosure provides an LED package structure and a lens thereof for effectively solving the above problems generated from the conventional LED package structure.

In summary, the LED package structure or the lens of the instant disclosure is provided with the boundary curved surfaces each having a first radius of curvature ($R_1$) and the side curved surfaces of the second light-guiding portion each having a second radius of curvature ($R_2$), which is different from the first radius of curvature, and the first radius of curvature and the second radius of curvature satisfy the first equation (i.e., $R_1/R_2 = M\sqrt{2}$ and $M=0.8~1.2$), thus the chip-mounting area and the light extraction efficiency of the LED package structure can be effectively increased.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Please refer to FIGS. 1 through 6, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1:
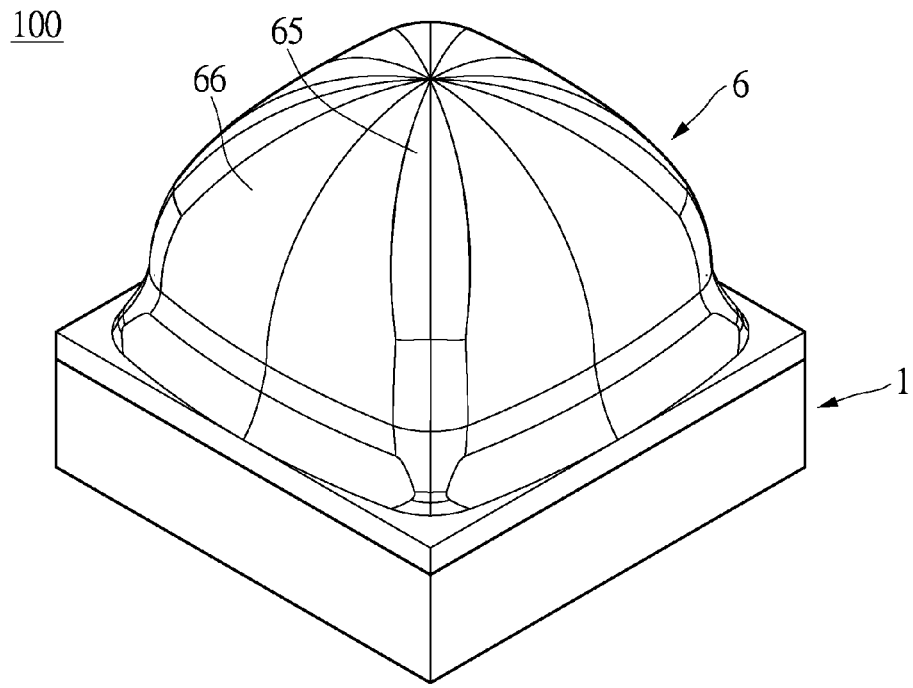
FIG. 1 is a perspective view showing an LED package structure according to a first embodiment of the instant disclosure.
Figure 2:
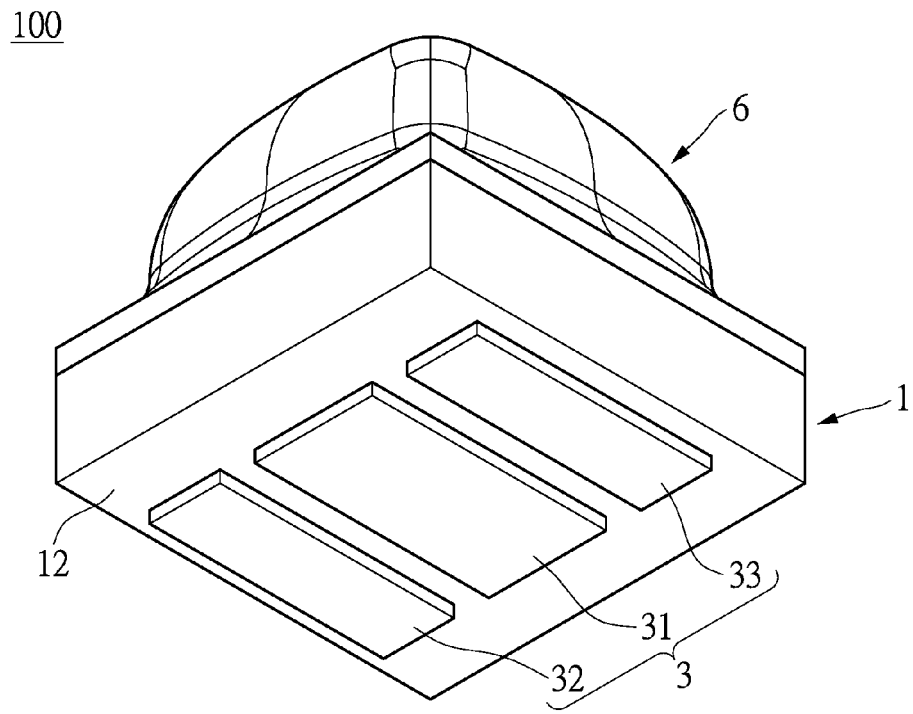
FIG. 2 is a perspective view of FIG. 1 from another perspective.
Figure 3:
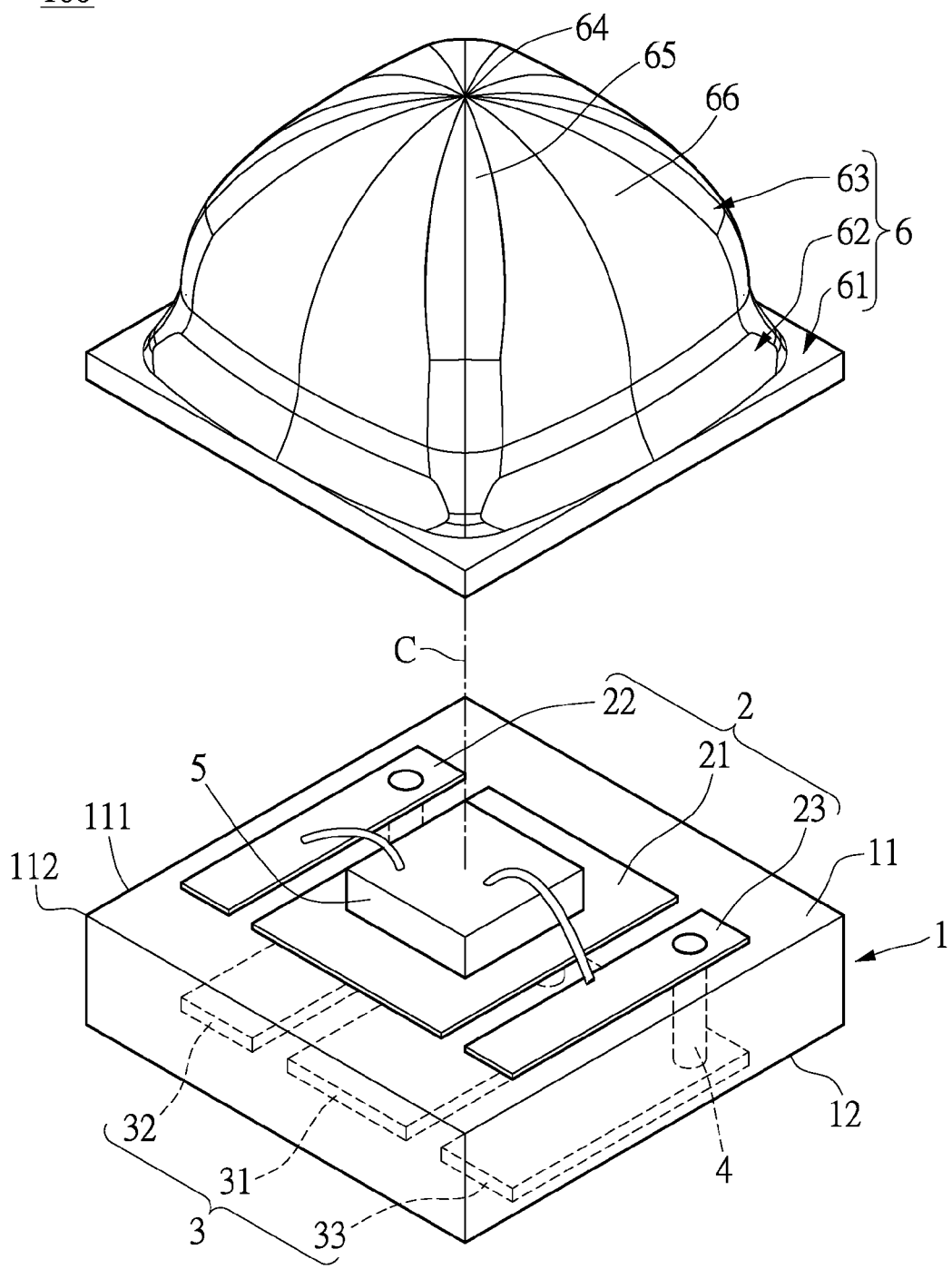
FIG. 3 is an exploded view of FIG. 1.

Please refer to FIGS. 1 through 3, which show an LED package structure 100. The LED package structure 100 in the instant embodiment is a chip scale package (CSP), but is not limited thereto. The LED package structure 100 includes a substrate 1 having a substantially square shape, a metallic layer 2 and a solder pad layer 3 respectively disposed on two opposite surfaces of the substrate 1, a plurality of conductive pillars 4 embedded in the substrate 1, at least one LED chip 5 disposed on the substrate 1 and electrically connected to the metallic layer 2, and a lens 6.

As shown in FIG. 3, the substrate 1 has a first surface 11 and a second surface 12 opposing to the first surface 11. The first surface 11 has four sides 111, four angles 112, and two diagonals 113 (shown in FIG. 4A). Each of the sides 111 of the first surface 11 has a length W (shown in FIG. 4A).

The metallic layer 2 is disposed on the first surface 11 of the substrate 1. The metallic layer 2 includes a heat-dissipating pad 21, a positive electrode pad 22, and a negative electrode pad 23. The heat-dissipating pad 21 is disposed on a substantial center of the first surface 11, and the positive electrode pad 22 and the negative electrode pad 23 are disposed on the first surface 11 and are respectively arranged on two opposite sides of the heat-dissipating pad 21.

The solder pad layer 3 is disposed on the second surface 12 of the substrate 1. The solder pad layer 3 includes a heat-dissipating solder pad 31, a positive electrode solder pad 32, and a negative electrode solder pad 33. The heat-dissipating solder pad 31 is disposed on a substantial center of the second surface 12, and the positive electrode solder pad 32 and the negative electrode solder pad 33 are disposed on the second surface 12 and are respectively arranged on two opposite sides of the heat-dissipating solder pad 31. The heat-dissipating solder pad 31 is located under the heat-dissipating pad 21, and the positive electrode solder pad 32 and the negative electrode solder pad 33 are respectively located under the positive electrode pad 22 and the negative electrode pad 23. Moreover, ends of the conductive pillars 4 (the top ends of the conductive pillars 4 in FIG. 3) are respectively connected to the heat-dissipating pad 21, the positive electrode pad 22, and the negative electrode pad 23, and the other ends of the conductive pillars 4 (the bottom ends of the conductive pillars 4 in FIG. 3) are respectively connected to the heat-dissipating solder pad 31, the positive electrode solder pad 32, and the negative electrode solder pad 33.

The LED chip 5 is mounted on the heat-dissipating pad 21 of the metallic layer 2, and two chip pads (not labeled) of the LED chip 5 are respectively and electrically connected to the positive electrode pad 22 and the negative electrode pad 23 of the metallic layer 2 by wire bonding, but the instant disclosure is not limited thereto. In a non-shown embodiment, the metallic layer 2 can be provided without the heat-dissipating pad 21, the LED chip 5 is directly mounted on the first surface 11 of the substrate 1, the positive electrode pad 22 and the negative electrode pad 23 are respectively arranged at two opposite sides of the LED chip 5, and two chip pads of the LED chip 5 are respectively and electrically connected to the positive electrode pad 22 and the negative electrode pad 23 by wire bonding.

As shown in FIGS. 3 through 6, the lens 6 is disposed on the first surface 11 of the substrate 1, such that the metallic layer 2 and the LED chip 5 are embedded in the lens 6. The lens 6 defines a central axis C, and the lens 6 is symmetrical to the central axis C. The lens 6 in the instant embodiment is an integral construction and includes a base layer 61, a first light-guiding portion 62 integrally connected to the base layer 61, and a second light-guiding portion 63 taperedly extended from the first light-guiding portion 62 in a direction away from the base layer 61 (or the substrate 1).

As shown in FIG. 3, the base layer 61 having a substantially square shape is disposed on the first surface 11 of the substrate 1. Four lateral surfaces of the base layer 61 are respectively coplanar with that of the substrate 1. The second light-guiding portion 63 has an apex 64 located away from the first light-guiding portion 62, and the apex 64 is located at the central axis C. A height of the first light-guiding portion 62 in the central axis C is smaller than that of the second light-guiding portion 63. It should be noted that, the following features, which are about the lens 6 orthogonally projected onto the first surface 11, can be regarded as the lens 6 orthogonally projected onto the base layer 61, because the four lateral surfaces of the base layer 61 are respectively coplanar with that of the substrate 1.

Figure 4A:
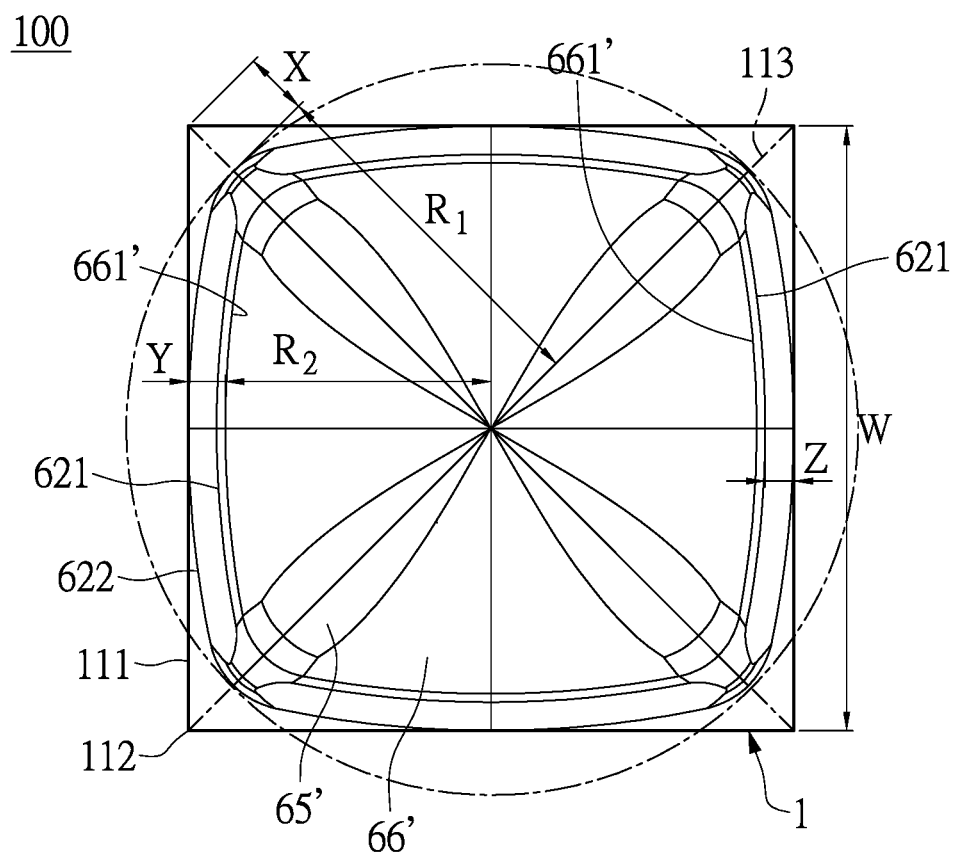
FIG. 4A is a schematic view showing a first projecting region and a second projecting region, which are defined by orthogonally projecting the first light-guiding portion and the second light-guiding portion onto the first surface of the substrate (or the base layer of the lens)

Specifically, an outer surface of the lens 6 includes four side curved surfaces 66 connected to the apex 64 and four boundary curved surfaces 65 connected to the apex 64, and any two adjacent boundary curved surfaces 65 are arranged with one of the side curved surfaces 66 there-between. As shown in FIGS. 3 and 4A, four first projecting regions 65' are defined by orthogonally projecting the four boundary curved surfaces 65 onto the first surface 11 (or the base layer 61), and the four first projecting regions 65' are arranged on the two diagonals 113 of the first surface 11 (or two diagonals of the base layer 61).

Figure 5:
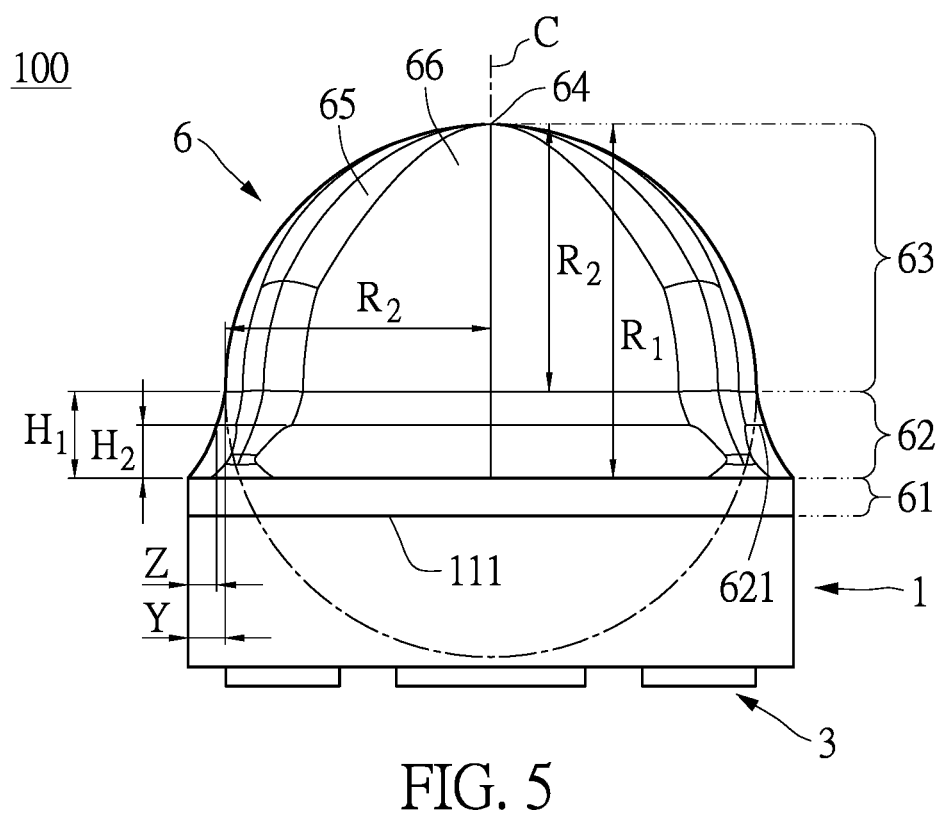
FIG. 5 is a side view of FIG. 1 from a perspective about one of the sides of the substrate.

As shown in FIGS. 3, 4A and 5, each of the boundary curved surfaces 65 has a first radius of curvature $R_1$, and the first radius of curvature $R_1$ is substantially equal to a length of each of the first projecting regions 65' projected in the corresponding diagonal 113. The first radius of curvature $R_1$ equal to a sum of a height $H_1$ of the first light-guiding portion 62 and a height of the second light-guiding portion 63 (i.e., $R_1=H_1+R_2$). In the instant embodiment, a center of curvature of each of the boundary curved surfaces 65 is located at the central axis C.

A portion of each of the side curved surfaces 66 arranged on the second light-guiding portion 63 has a second radius of curvature $R_2$. Specifically, a portion of each of the side curved surfaces 66 arranged on the second light-guiding portion 63 has a height equal to the second radius of curvature $R_2$ of the second light-guiding portion 63. More specifically, as shown in FIG. 5, the second light-guiding portion 63 substantially has a shape of semicircular. In the instant embodiment, a center of curvature of each of the side curved surfaces 66 is located at the central axis C, and the second radius of curvature $R_2$ is equal to the height of the second light-guiding portion 63, so the first radius of curvature $R_1$ minus the second radius of curvature $R_2$ is equal to the height $H_1$ of the first light-guiding portion 62 (i.e., $R_1-R_2=H_1$).

Moreover, as shown in FIGS. 3 and 4A, four second projecting regions 66' are defined by orthogonally projecting the four side curved surfaces 66 onto the first surface 11 (or the base layer 61), and each one of the second projecting regions 66' has an arc boundary 661' arranged away from the central axis C. A sum of the second radius of curvature $R_2$ and a shortest distance between each arc boundary 661' and the adjacent side 111 is equal to a half of the length of each side 111 (i.e., $Y+R_2=W/2$).

Figure 4B:
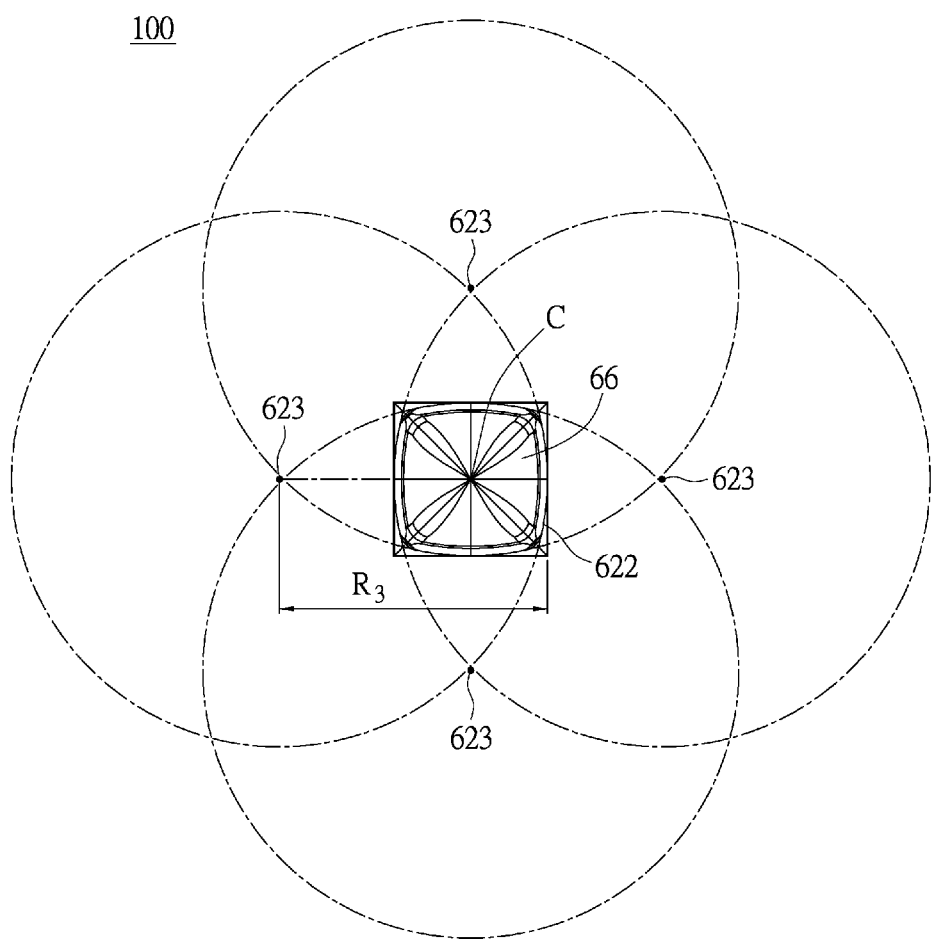
FIG. 4B is a top view of FIG. 1 showing the bottom curved surfaces of the first light-guiding portion each having a third radius of curvature.

As shown in FIGS. 4A and 4B, each of the side curved surfaces 66 has a bottom curved surface 622 connected to the base layer 61 and arranged on the first light-guiding portion 62. Each of the bottom curved surfaces 622 has an arc shape, and a radius of curvature $R_3$ of each of the bottom curved surfaces 622 is greater than each of the sides 111 of the first surface 11 (or each of the sides of the base layer 61). A center of curvature 623 of each of the bottom curved surfaces 622 is located at a perpendicular bisector of the adjacent side 111 of the first surface 11, and a distance between the central axis C and the center of curvature 623 of each of the bottom curved surfaces 622 is the same.

As shown in FIGS. 3 and 4A, each of the boundary curved surfaces 65 has a radius of curvature gradually decreased from the center portion thereof toward two opposite sides thereof, and a maximum value of the radius of curvature of each of the boundary curved surfaces 65 is the first radius of curvature $R_1$. Each of the side curved surfaces 66 has a radius of curvature gradually increased from the center portion thereof toward two opposite sides thereof, and a minimum value of the radius of curvature of each of the side curved surfaces 66 is the second radius of curvature $R_2$. Moreover, the first radius of curvature $R_1$ and the second radius of curvature $R_2$ satisfy the following first equation: $R_1/R_2=M\sqrt{2}$ and $M=0.8\sim1.2$.

Figure 6:
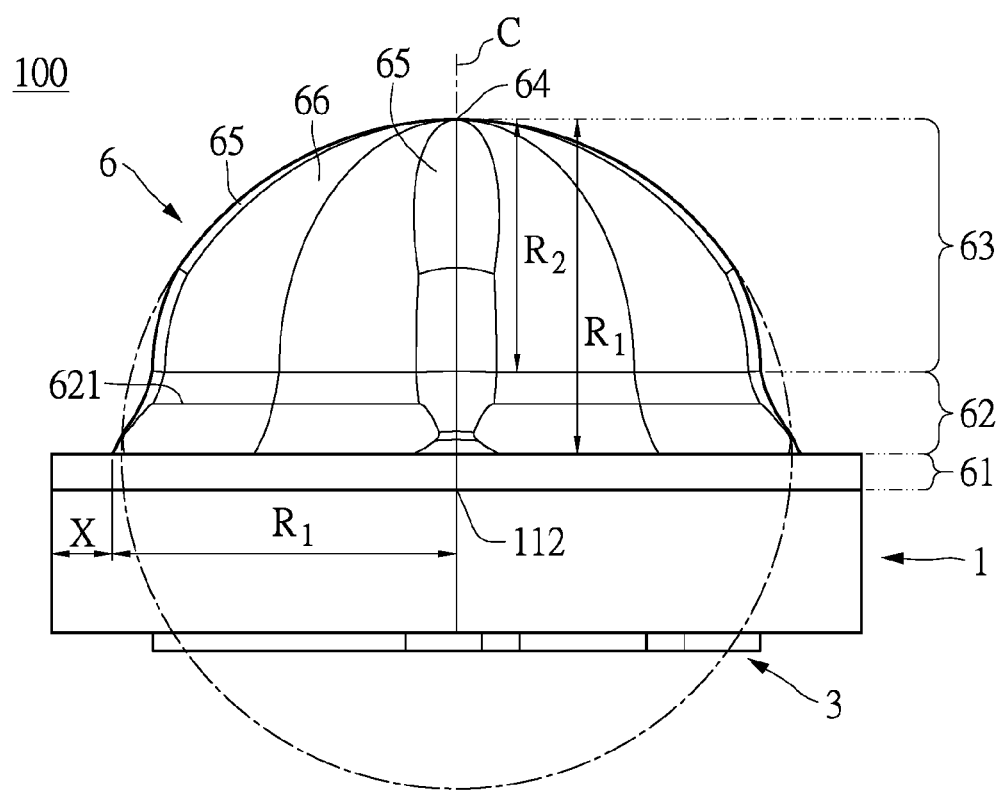
FIG. 6 is a side view of FIG. 1 from a perspective about one of the angles of the substrate.
Figure 7:
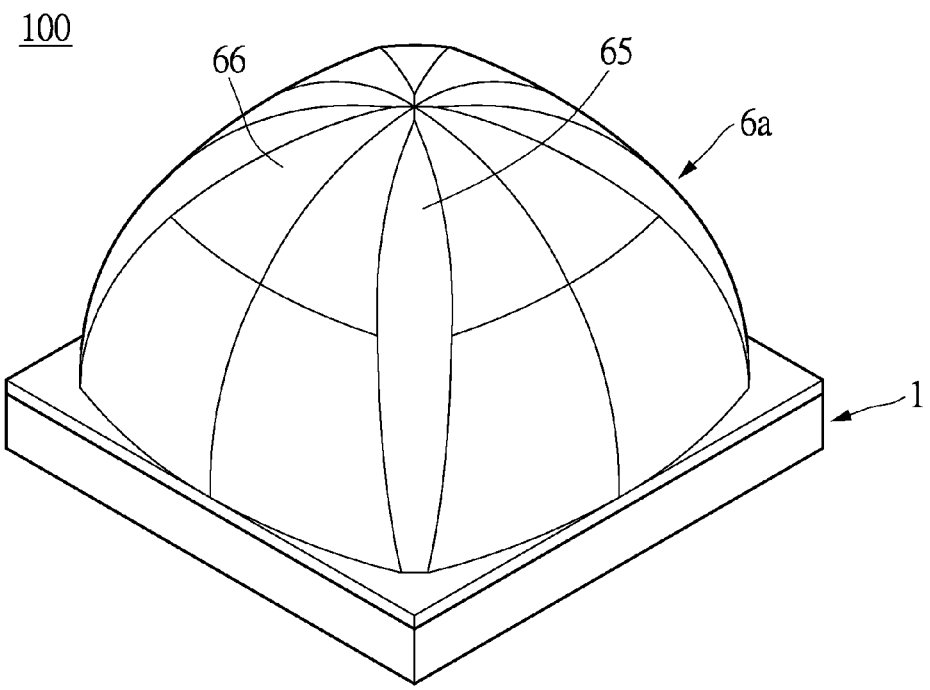
FIG. 7 is a perspective view showing an LED package structure according to a second embodiment of the instant disclosure.
Figure 8:
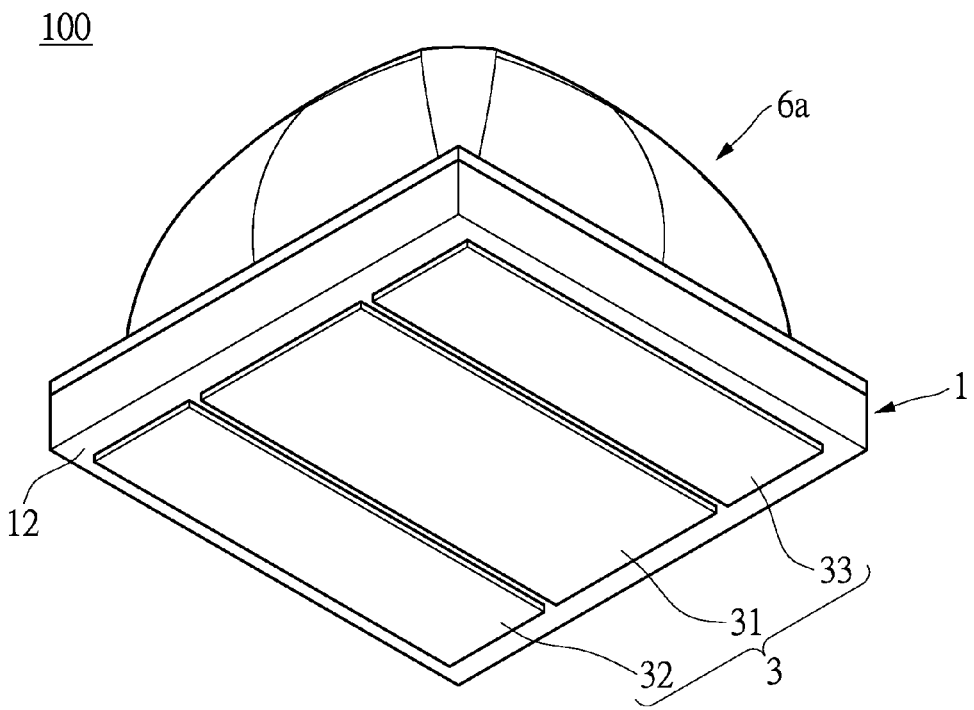
FIG. 8 is a perspective view of FIG. 7 from another perspective.
Figure 9:
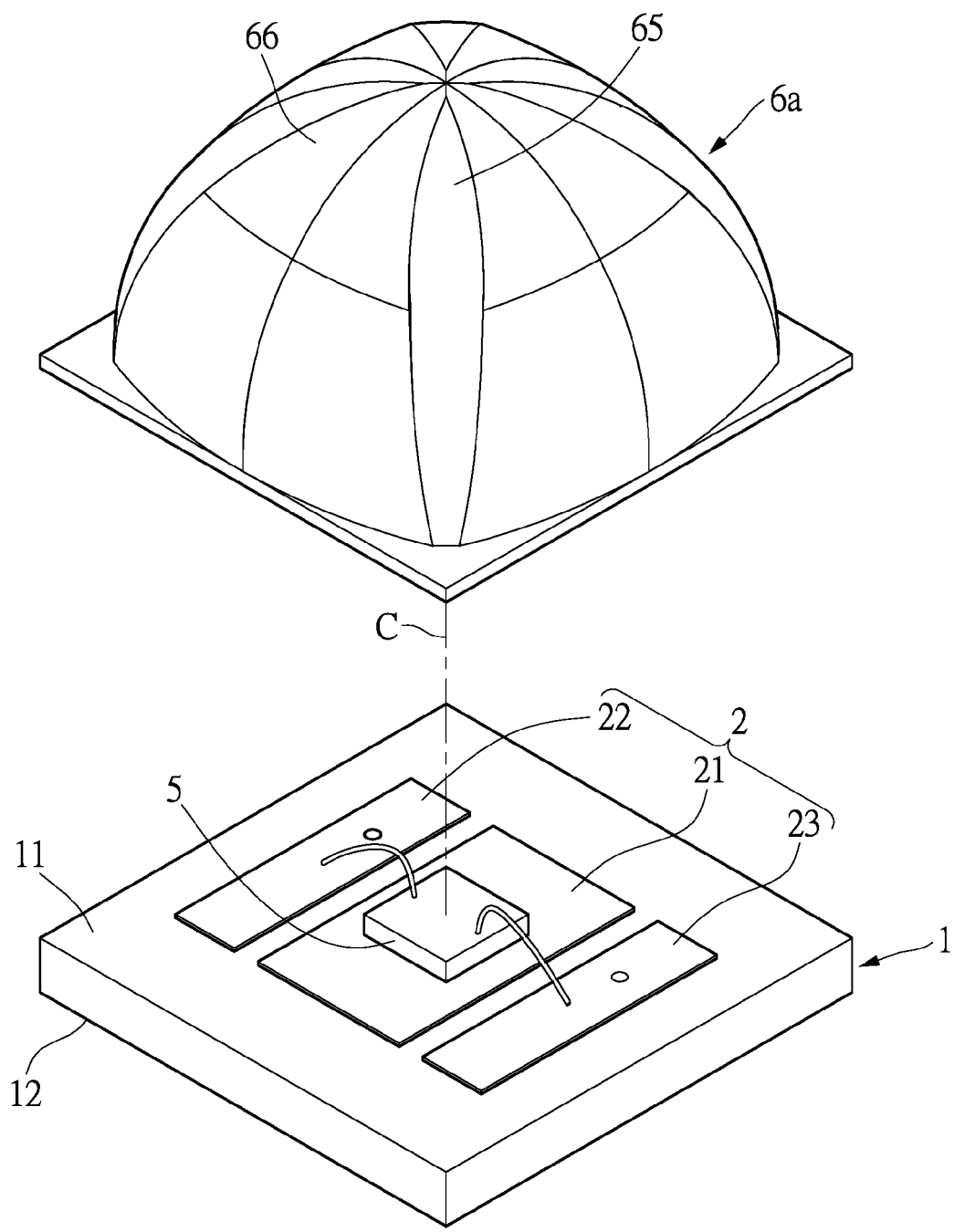
FIG. 9 is an exploded view of FIG. 7.
Figure 10A:
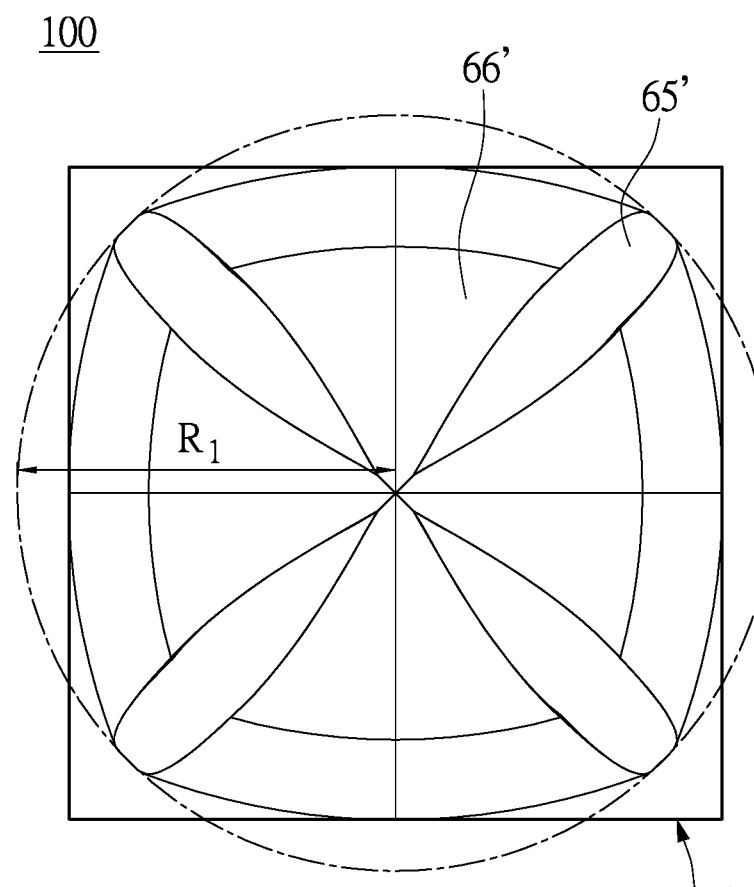
FIG. 10A is a schematic view showing a projecting region, which is defined by orthogonally projecting the lens onto the substrate.
Figure 10B:
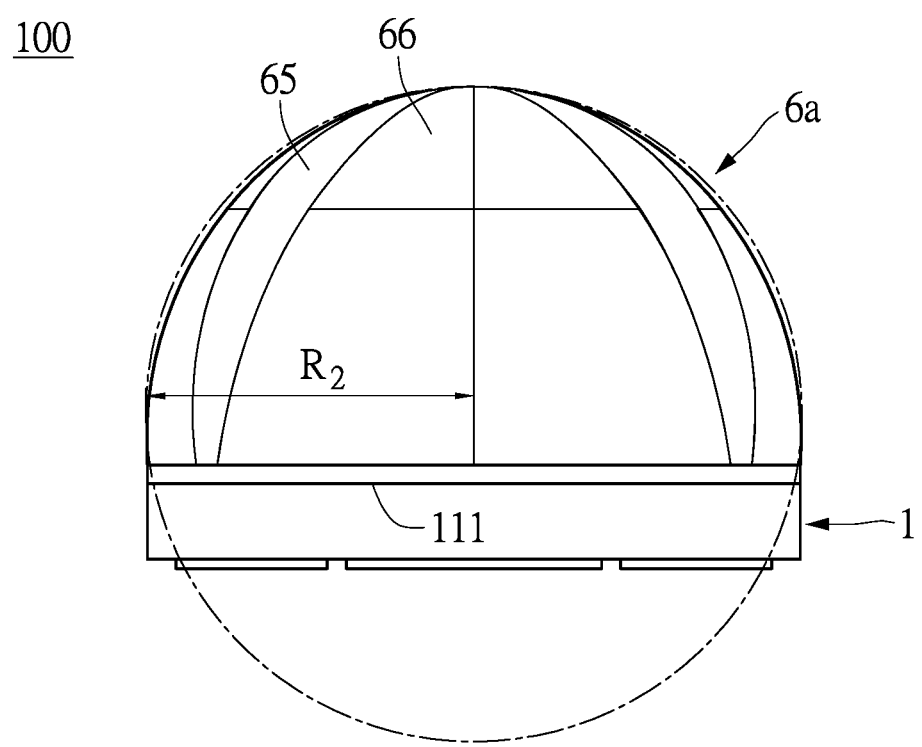
FIG. 10B is a side view of FIG. 7 from a perspective about one of the sides of the substrate.
Figure 10C:
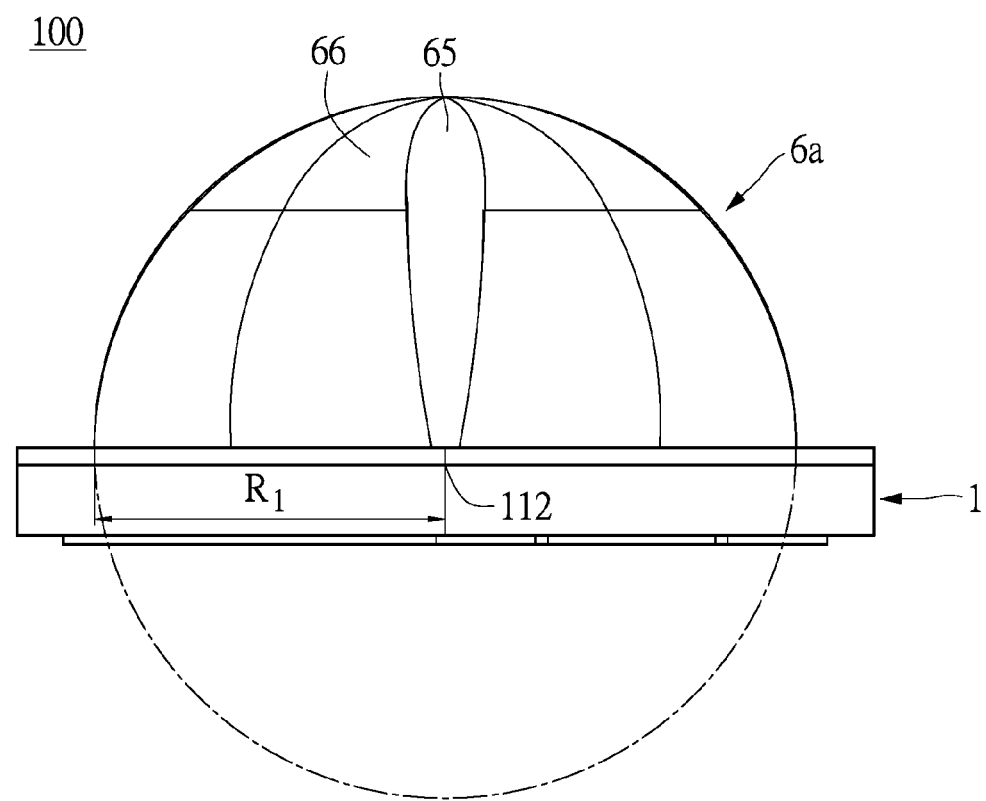
FIG. 10C is a side view of FIG. 7 from a perspective about one of the angles of the substrate.
Figure 11:
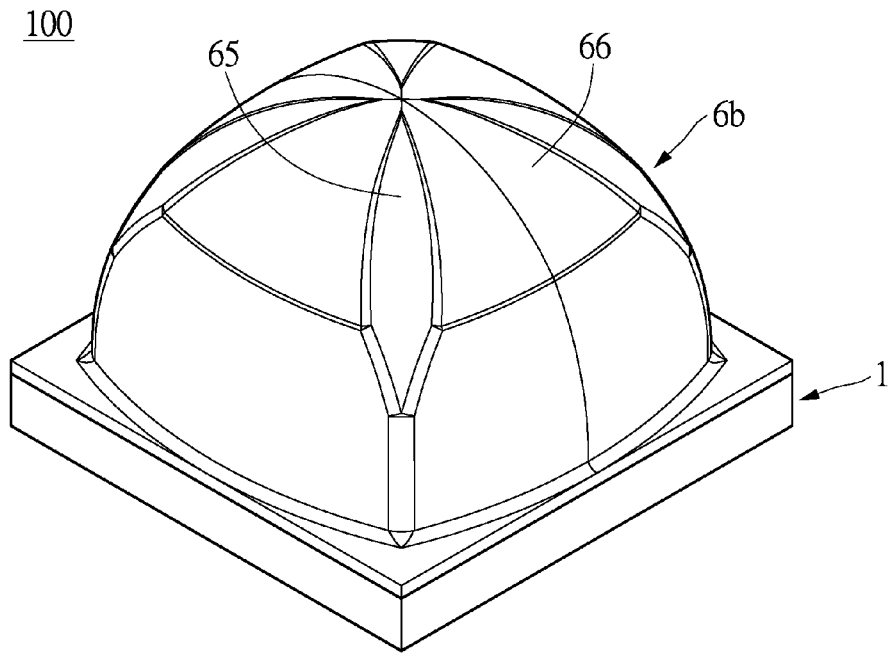
FIG. 11 is a perspective view showing an LED package structure according to a third embodiment of the instant disclosure.
Figure 12:
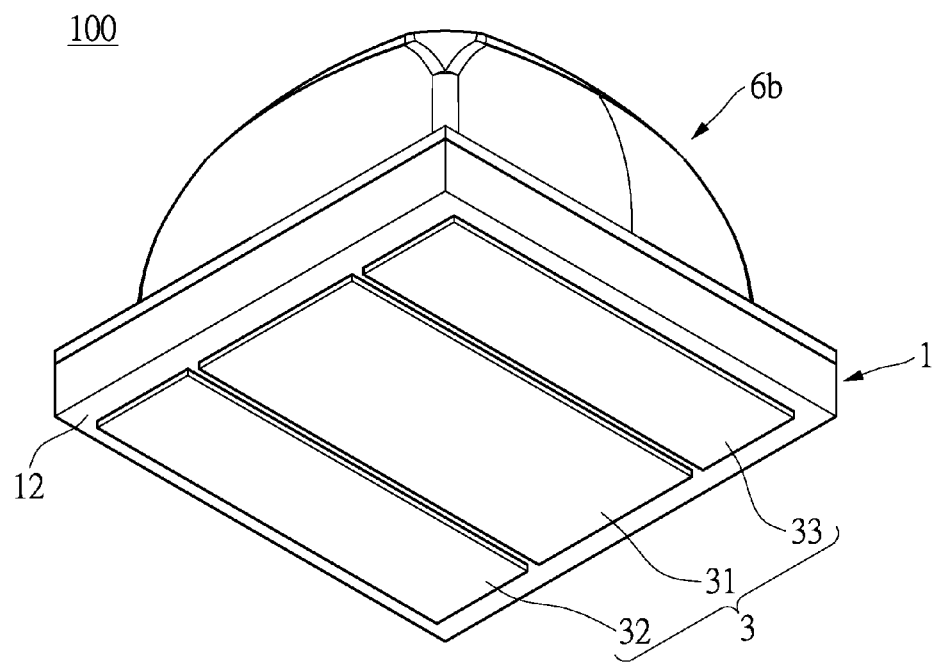
FIG. 12 is a perspective view of FIG. 11 from another perspective.
Figure 13:
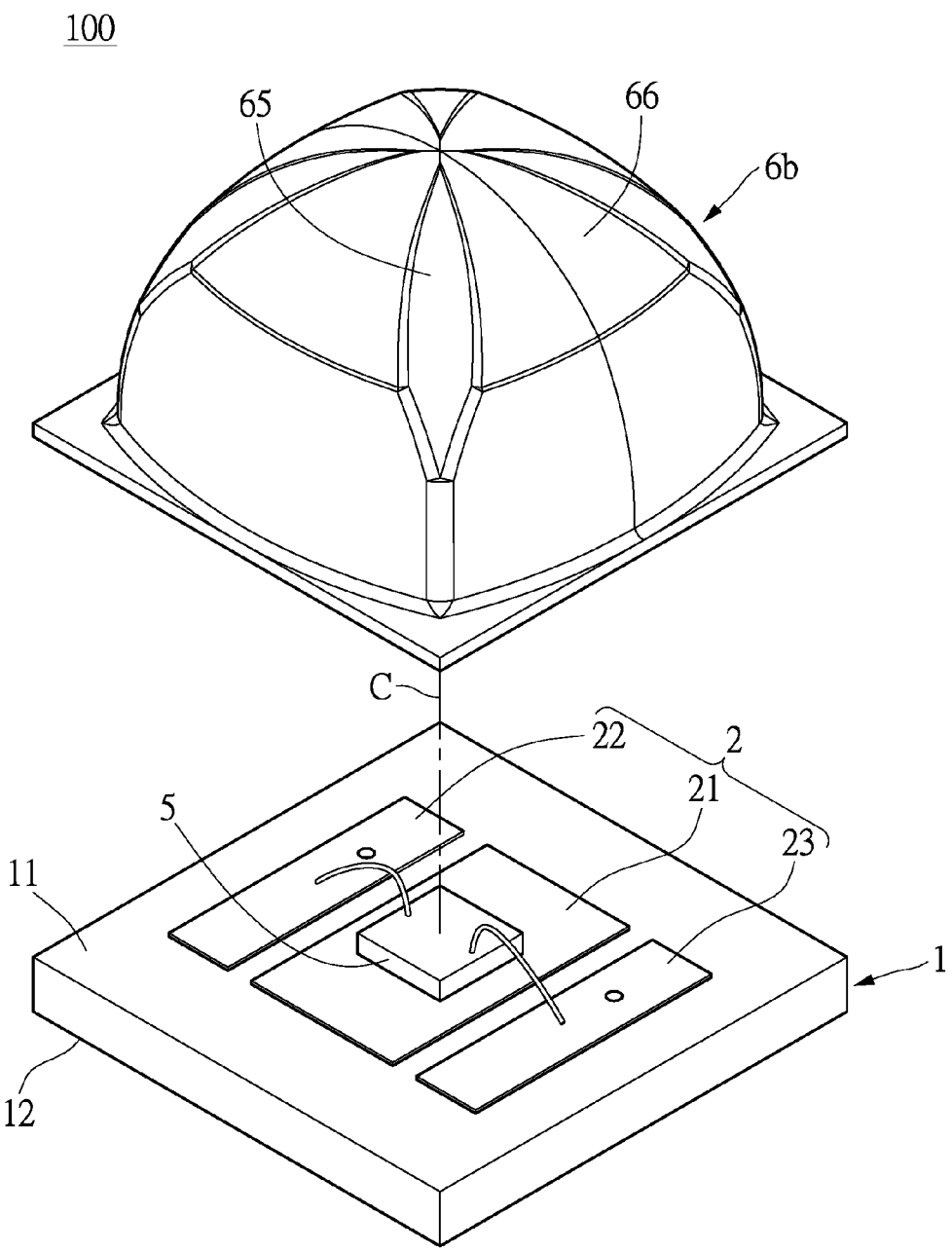
FIG. 13 is an exploded view of FIG. 11.
Figure 14A:
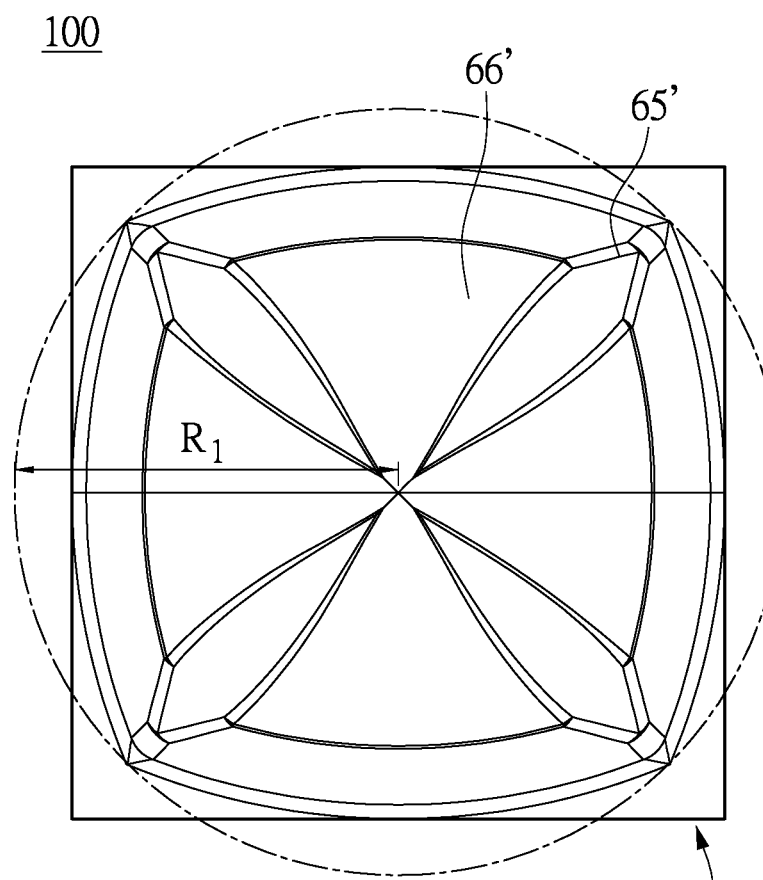
FIG. 14A is a schematic view showing a projecting region, which is defined by orthogonally projecting the lens onto the substrate.
Figure 14B:
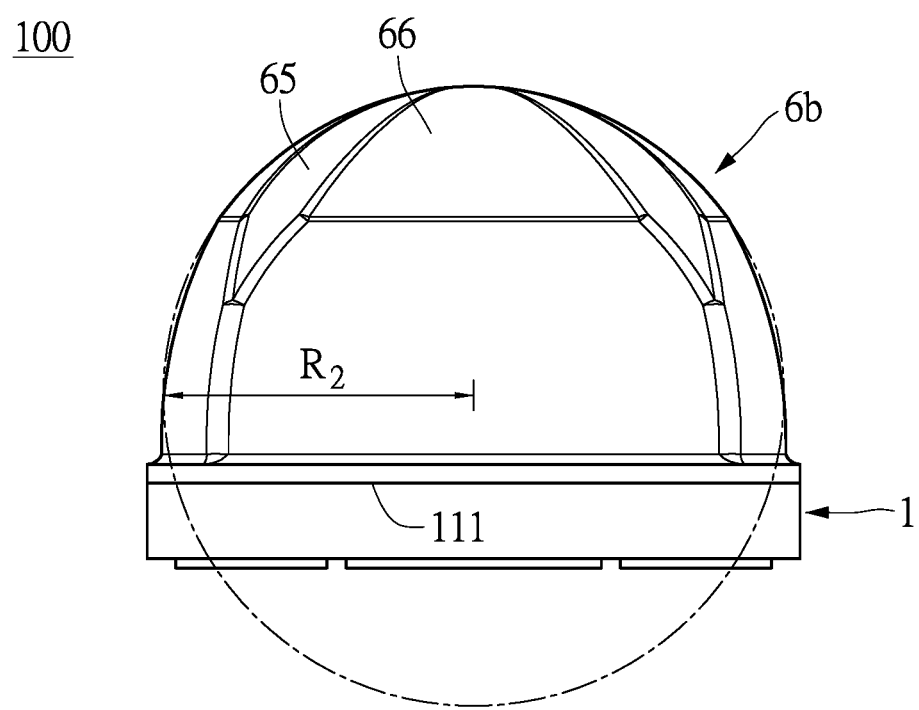
FIG. 14B is a side view of FIG. 11 from a perspective about one of the sides of the substrate.
Figure 14C:
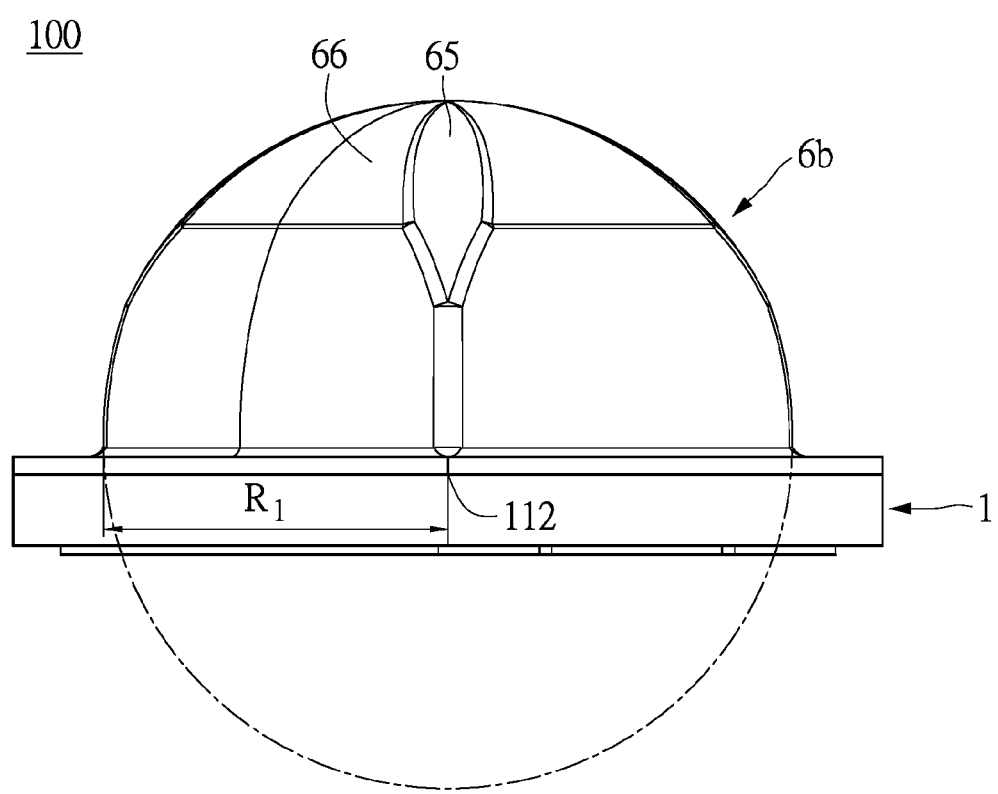
FIG. 14C is a side view of FIG. 11 from a perspective about one of the angles of the substrate.

Specifically, as shown in FIGS. 4A and 6, an outer surface of the first light-guiding portion 62 has a predetermined boundary 621, a projecting position defined by orthogonally projecting the predetermined boundary 621 onto the first surface 11 (or the base layer 61) and the adjacent side 111 of the first surface 11 (or the adjacent side of the base layer 61) has a shortest distance Z of 0.05 mm~0.1 mm, and the shortest distance Z is preferably 0.075 mm. The second radius of curvature $R_2$ satisfies the following second equation:

$$R_2 = \frac{(4W + 1.1757Z) + \sqrt{(4W + 1.17157Z)^2 - 16W^2}}{8}$$

Moreover, when Z=0.075 mm, the second equation is disclosed as follows:

$$R_2 = \frac{(4W + 0.08787) + \sqrt{(4W + 0.08787)^2 - 16W^2}}{8}$$

Specifically, as shown in FIGS. 4A, 5 and 6, the following description approximately discloses the derivation of the second equation. Each of the first projecting regions 65' and the adjacent angle 112 has a shortest distance X, the arc boundary 661' of each of the second projecting regions 66' and the adjacent side 111 has a shortest distance Y, and the predetermined boundary 621 and the base layer 61 has a distance $H_2$. FIGS. 4A and 6 each shows that $(R_1+X)/W=0.5\sqrt{2}$ and $(R_2+Y)/W=0.5$. FIG. 5 shows that $R_1=R_2+H_1$. Moreover, FIGS. 4A through 6 show the following conditions:

$2(X+R_1)=\sqrt{2}\times 2(Y+R_2)$ $W-2Y=2R_2$ $W \geq 2R_2$ $\sqrt{2} > 2R_1$ $H_1=R_1-R_2$ $$\frac{Z}{H_2} = \frac{Y}{H_1} \rightarrow H_2 = \frac{2Z(R_1 - R_2)}{W - 2R_2}$$

$X \approx H_2 \approx \sqrt{2}Y$

The second equation can be obtained by calculating the above conditions to get a positive root solution, and the process is approximately disclosed as follows.

$$Y = \frac{W - 2R_2}{2} = \frac{H_1 Z}{H_2} = \frac{(\sqrt{2}-1)R_2 Z}{\sqrt{2} Y}$$

$$Y^2 = 0.29289 R_2 Z = \left(\frac{W - 2R_2}{2}\right)^2$$

$(W-2R_2)^2=1.17157R_2Z$ $W^2-4R_2W+4R_2^2=1.17157R_2Z$ $4R_2^2-R_2(4W+1.17157Z)+W^2=0$ $$R_2 = \frac{(4W + 1.1757Z) + \sqrt{(4W + 1.17157Z)^2 - 16W^2}}{8}$$

Thus, when the first radius of curvature $R_1$ and the second radius of curvature $R_2$ satisfy the first equation (i.e., $R_1/R_2=M\sqrt{2}$ and M=0.8~1.2), the chip-mounting area and the light extraction efficiency of the LED package structure 100 can be effectively increased. Moreover, when the first radius of curvature $R_1$ and the second radius of curvature $R_2$ satisfy the first equation and the second equation, the chip-mounting area and the light extraction efficiency of the LED package structure 100 can be further improved.

In addition, if the first radius of curvature $R_1$ and the second radius of curvature $R_2$ satisfy the first equation (i.e., $R_1/R_2=M\sqrt{2}$ and M=0.8~1.2), the construction of the lens 6 can be adjusted according to the designer's demand, such as the lens 6a shown in FIGS. 7 through 10c, or the lens 6b shown in FIGS. 11 through 14c.

[The Possible Effect of the Instant Embodiments]

In summary, the LED package structure and the lens is provided with the boundary curved surfaces each having a first radius of curvature ($R_1$) and the side curved surfaces each having a second radius of curvature ($R_2$), which is different from the first radius of curvature, and the first radius of curvature and the second radius of curvature satisfy the first equation (i.e., $R_1/R_2=M\sqrt{2}$ and M=0.8~1.2), thus the chip-mounting area and the light extraction efficiency of the LED package structure can be effectively increased.

Moreover, when the first radius of curvature and the second radius of curvature satisfy the first equation and the second equation, the chip-mounting area and the light extraction efficiency of the LED package structure can be further improved.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A light emitting diode (LED) package structure, comprising:
    a power supply component disposed on the support structure and electrically connected between the circuit substrate and electrical connector structure;
    a substrate having a substantially square shape, wherein the substrate includes a first surface and a second surface opposing to the first surface, the first surface includes four sides, four angles, and two diagonals;
    a metallic layer disposed on the first surface of the substrate;
    at least one LED chip mounted on the substrate and electrically connected to the metallic layer; and
    a lens disposed on the first surface of the substrate, such that the metallic layer and the at least one LED chip are embedded in the lens, the lens comprising:
        a base layer disposed on the first surface of the substrate;
        a first light-guiding portion integrally connected to the base layer; and
        a second light-guiding portion taperedly extended from the first light-guiding portion in a direction away from the substrate, the second light-guiding portion having an apex located away from the first light-guiding portion;
    wherein an outer surface of the lens includes four side curved surfaces connected to the apex and four boundary curved surfaces connected to the apex, and any two adjacent boundary curved surfaces are arranged with one of the side curved surfaces therebetween, wherein four first projecting regions are defined by orthogonally projecting the four boundary curved surfaces onto the base layer, and the four first projecting regions are arranged on the two diagonals of the square of the first surface, wherein each of the boundary curved surfaces has a first radius of curvature defined as R1, a portion of each of the side curved surfaces arranged on the second light-guiding portion has a second radius of curvature defined as R2, wherein R1/R2=M$\sqrt{2}$ and M=0.8~1.2.

2. The LED package structure as claimed in claim 1, wherein the lens defines a central axis, the lens is symmetrical to the central axis, the apex is located at the central axis, and a height of the first light-guiding portion in the central axis is smaller than that of the second light-guiding portion.

3. The LED package structure as claimed in claim 2, wherein the first radius of curvature is substantially equal to a length of each of the first projecting regions projected in the corresponding diagonal.

4. The LED package structure as claimed in claim 3, wherein a portion of each of the side curved surfaces arranged on the second light-guiding portion has a height in the central axis being equal to the second radius of curvature.

5. The LED package structure as claimed in claim 4, wherein a center of curvature of each of the boundary curved surfaces and a center of curvature of each of the side curved surfaces are located at the central axis, and the first radius of curvature minus the second radius of curvature is equal to the height of the first light-guiding portion in the central axis.

6. The LED package structure as claimed in claim 5, wherein an outer surface of the first light-guiding portion has a predetermined boundary, a projecting position defined by orthogonally projecting the predetermined boundary onto the first surface and an adjacent side of the first surface have a shortest distance of 0.05 mm~0.1 mm, wherein the shortest distance is defined as Z, a length of each of the sides of the first surface is defined as W, and the second radius of curvature satisfies an equation:

$$R_2 = \frac{(4W + 1.1757Z) + \sqrt{(4W + 1.17157Z)^2 - 16W^2}}{8}.$$

7. The LED package structure as claimed in claim 1, wherein each of the boundary curved surfaces has a radius of curvature gradually decreased from a center portion thereof toward two opposite sides thereof, and a maximum value of the radius of curvature of each of the boundary curved surfaces is the first radius of curvature; each of the side curved surfaces has a radius of curvature gradually increased from a center portion thereof toward two opposite sides thereof, and a minimum value of the radius of curvature of each of the side curved surfaces is the second radius of curvature.

8. The LED package structure as claimed in claim 1, wherein each of the side curved surfaces has a bottom curved surface connected to the base layer and arranged on the first light-guiding portion, each of the bottom curved surfaces has an arc shape, and a radius of curvature of each of the bottom curved surfaces is greater than a length of each of the sides of the first surface.

9. The LED package structure as claimed in claim 8, wherein a center of curvature of each of the bottom curved surfaces is located at a perpendicular bisector of the respective adjacent side of the first surface.

10. The LED package structure as claimed in claim 9, wherein a distance between the central axis and the center of curvature of each of the bottom curved surfaces is the same.

11. A lens of a light emitting diode (LED) package structure, comprising:

a base layer having a substantially square shape, wherein the base layer includes four sides, four angles, and two diagonals;

a first light-guiding portion integrally connected to the base layer; and a second light-guiding portion taperedly extended from the first light-guiding portion in a direction away from the base layer, the second light-guiding portion having an apex located away from the first light-guiding portion;

wherein an outer surface of the lens includes four side curved surfaces connected to the apex and four boundary curved surfaces connected to the apex, and any two adjacent boundary curved surfaces are arranged with one of the side curved surfaces there-between, wherein four first projecting regions are defined by orthogonally projecting the four boundary curved surfaces onto the base layer, and the four first projecting regions are arranged on the two diagonals of the square of the base layer, wherein each of the boundary curved surfaces has a first radius of curvature defined as R1, a portion of each of the side curved surfaces arranged on the second light-guiding portion has a second radius of curvature defined as R2, wherein R1/R2=M$\sqrt{2}$ and M=0.8~1.2.

12. The lens of the LED package structure as claimed in claim 11, wherein the lens defines a central axis, the lens is symmetrical to the central axis, the apex is located at the central axis, and a height of the first light-guiding portion in the central axis is smaller than that of the second light-guiding portion.

13. The lens of the LED package structure as claimed in claim 12, wherein the first radius of curvature is substantially equal to a length of each of the first projecting regions projected in the corresponding diagonal.

14. The lens of the LED package structure as claimed in claim 13, wherein a portion of each of the side curved surfaces arranged on the second light-guiding portion has a height in the central axis being equal to the second radius of curvature.

15. The lens of the LED package structure as claimed in claim 14, wherein a center of curvature of each of the boundary curved surfaces and a center of curvature of each of the side curved surfaces are located at the central axis, and the first radius of curvature minus the second radius of curvature is equal to the height of the first light-guiding portion in the central axis.

16. The lens of the LED package structure as claimed in claim 15, wherein an outer surface of the first light-guiding portion has a predetermined boundary, a projecting position defined by orthogonally projecting the predetermined boundary onto the base layer and an adjacent side of the base layer have a shortest distance of 0.05 mm~0.1 mm, wherein the shortest distance is defined as Z, a length of each of the sides of the base layer is defined as W, and the second radius of curvature satisfies an equation:

$$R_2 = \frac{(4W + 1.1757Z) + \sqrt{(4W + 1.17157Z)^2 - 16W^2}}{8}.$$

17. The lens of the LED package structure as claimed in claim 11, wherein each of the boundary curved surfaces has a radius of curvature gradually decreased from a center portion thereof toward two opposite sides thereof, and a maximum value of the radius of curvature of each of the boundary curved surfaces is the first radius of curvature; each of the side curved surfaces has a radius of curvature gradually increased from a center portion thereof toward two opposite sides thereof, and a minimum value of the radius of curvature of each of the side curved surfaces is the second radius of curvature.

18. The lens of the LED package structure as claimed in claim 11, wherein each of the side curved surfaces has a bottom curved surface connected to the base layer and arranged on the first light-guiding portion, each of the bottom curved surfaces has an arc shape, and a radius of curvature of each of the bottom curved surfaces is greater than a length of each of the sides of the base layer.

19. The lens of the LED package structure as claimed in claim 18, wherein a center of curvature of each of the bottom curved surfaces is located at a perpendicular bisector of the respective adjacent side of the base layer.

20. The lens of the LED package structure as claimed in claim 19, wherein a distance between the central axis and the center of curvature of each of the bottom curved surfaces is the same.

* * * * *